(12) United States Patent
Chen et al.

(10) Patent No.: US 10,564,685 B2
(45) Date of Patent: Feb. 18, 2020

(54) COMPACT TOOL-LESS GENERAL PURPOSE GRAPHIC PROCESSING UNITS (GPGPU) MODULE

(71) Applicant: QUANTA COMPUTER INC., Taoyuan (TW)

(72) Inventors: Chao-Jung Chen, Taoyuan (TW); Yaw-Tzorng Tsorng, Taoyuan (TW); Chun Chang, Taoyuan (TW); Yao-Long Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/895,356

(22) Filed: Feb. 13, 2018

(65) Prior Publication Data

US 2019/0138065 A1 May 9, 2019

Related U.S. Application Data

(60) Provisional application No. 62/583,687, filed on Nov. 9, 2017.

(51) Int. Cl.
*G06F 1/18* (2006.01)
*H05K 7/14* (2006.01)

(52) U.S. Cl.
CPC .............. *G06F 1/186* (2013.01); *G06F 1/185* (2013.01); *H05K 7/1487* (2013.01)

(58) Field of Classification Search
CPC ........ G06F 1/186; G06F 1/185; H05K 7/1487
See application file for complete search history.

(56) References Cited

U.S. PATENT DOCUMENTS

| 5,325,263 | A | * | 6/1994 | Singer | G06F 1/184 361/679.39 |
| 5,338,214 | A | * | 8/1994 | Steffes | G06F 1/184 361/679.32 |
| 5,576,938 | A | * | 11/1996 | Beun | H02B 1/04 174/50 |
| 5,721,669 | A | * | 2/1998 | Becker | G11B 33/124 361/679.31 |
| 5,831,821 | A | * | 11/1998 | Scholder | G06F 1/184 361/679.32 |

(Continued)

OTHER PUBLICATIONS

Extended European Search Report for EP Application No. 18184221.2, dated Feb. 18, 2019.

*Primary Examiner* — Jinhee J Lee
*Assistant Examiner* — Theron S Milliser
(74) *Attorney, Agent, or Firm* — Nixon Peabody LLP; Zhou Lu (57) ABSTRACT

A computing device is provided with a slot that includes at least one locking element configured to receive a removable general purpose graphic processing unit (GPGPU) carrier. The GPGPU carrier includes a bracket with a first receiving space for securing a first GPGPU, and a second receiving space for securing a second GPGPU. The GPGPU carrier also includes a locking mechanism connected to the bracket and configured to secure the at least one locking element of the computing device to at least one securing mechanism corresponding to the at least one locking element. The locking mechanism includes a lever connected to gear drives configured to actuate the at least one securing mechanism upon actuating the lever.

16 Claims, 7 Drawing Sheets

(56) References Cited

U.S. PATENT DOCUMENTS

| | | | | |
|---|---|---|---|---|
| 5,873,745 A * | 2/1999 | Duclos | ............ | H01R 13/62944 439/157 |
| 6,288,898 B1 * | 9/2001 | Johnson | ................... | G06F 1/183 165/104.33 |
| 6,292,361 B1 * | 9/2001 | Johnson | ................... | G06F 1/183 165/104.33 |
| 6,606,255 B2 * | 8/2003 | Barringer | ............ | H05K 5/0256 361/679.02 |
| 7,265,996 B2 * | 9/2007 | Fan | ...................... | H05K 7/1408 312/223.2 |
| 7,771,218 B2 * | 8/2010 | Jaramillo | ............. | H05K 7/1492 439/157 |
| 7,817,430 B2 * | 10/2010 | Sherrod | ............ | H05K 7/20736 211/41.17 |
| 8,295,060 B2 * | 10/2012 | Liu | ......................... | G06F 1/185 174/520 |
| 8,514,586 B2 * | 8/2013 | Tan | ......................... | G06F 1/186 361/679.41 |
| 8,848,358 B2 * | 9/2014 | Peng | ....................... | G06F 1/185 361/679.31 |
| 9,462,719 B2 * | 10/2016 | Wu | ....................... | H05K 7/1409 |
| 9,703,333 B1 * | 7/2017 | Harting | ................... | G06F 1/187 |
| 9,826,658 B1 * | 11/2017 | Mao | ....................... | H05K 7/1487 |
| 2003/0117779 A1 * | 6/2003 | Gough | ................. | H05K 7/1488 361/728 |
| 2006/0067063 A1 * | 3/2006 | Stahl | .................... | H05K 7/1409 361/754 |
| 2009/0027843 A1 * | 1/2009 | Roesner | ................... | G06F 1/184 361/679.02 |
| 2013/0027875 A1 | 1/2013 | Zhu et al. | | |
| 2014/0254086 A1 * | 9/2014 | Li | ..................... | H01R 13/62944 361/679.32 |
| 2015/0070858 A1 | 3/2015 | Wu et al. | | |
| 2015/0085451 A1 | 3/2015 | Yu | | |
| 2015/0103492 A1 * | 4/2015 | Wu | ......................... | G06F 1/185 361/726 |
| 2015/0205333 A1 * | 7/2015 | Chang | ..................... | G06F 1/186 361/679.32 |
| 2017/0045921 A1 * | 2/2017 | Norton | ................. | H05K 7/1487 |

* cited by examiner

COMPACT TOOL-LESS GENERAL PURPOSE GRAPHIC PROCESSING UNITS (GPGPU) MODULE

CROSS REFERENCE TO RELATED APPLICATIONS

This application claims priority to U.S. Provisional Application No. 62/583,687 entitled "NEW GPGPU EASY SERVICE MODULE", filed on Nov. 9, 2017, the contents of which are incorporated by reference in its entirety.

FIELD OF THE INVENTION

The present invention relates to general purpose graphic processing unit (GPGPU) carriers, and more specifically to compact and tool-less GPGPU carriers.

BACKGROUND

General purpose graphic processing units (GPGPUs) are commonly utilized to perform computation in applications traditionally handled by a central processing unit (CPU). Even a single GPU-CPU framework provides advantages that multiple CPUs on their own do not offer due to the specialization in each chip. While GPUs operate at lower frequencies, they typically have many times the number of cores. Thus, GPUs can effectively operate on pictures and graphical data far faster than a traditional CPU. Migrating data into graphical form, and then using the GPU to scan and analyze it, can result in profound speedup. In computer architecture, speedup is a process for increasing the performance between two systems processing the same problem. More technically, it is the improvement in speed of execution of a task executed on two similar architectures with different resources.

Removing a GPGPU from many types of computer systems today requires tools and involves pulling cables from cable sockets. Over time, or through incorrect usage, these cables or sockets become frail and can introduce data transfer errors associated with the GPGPU in use. Installing a GPGPU is not any easier because it involves similar hardships.

Furthermore, a computer data center (also referred to as an Internet data center or an enterprise data center) may contain a myriad of computer systems utilizing various GPGPUs. The large number of high-capacity GPGPUs in a data center poses significant problems associated with their removal and installation. The time and skills involved in removing or installing GPGPUs without damage, in a data center, can become burdensome.

Accordingly, it is becoming extremely important for various reasons (such as data backup and generally a GPGPU) to be able to easily, quickly, and efficiently remove and install a GPGPU in a computer system.

SUMMARY

Embodiments of the invention concern compact and tool-less general purpose graphic processing unit (GPGPU) carriers. A computing device is provided with a slot that includes at least one locking element configured to receive a removable general purpose graphic processing unit (GPGPU) carrier. The GPGPU carrier can include a bracket with a first receiving space for securing a first GPGPU, and a second receiving space for securing a second GPGPU. The GPGPU carrier can also include a locking mechanism connected to the bracket and configured to secure the at least one locking element of the computing device to at least one securing mechanism that corresponds to the at least one locking element. The locking mechanism can include a lever connected to gear drives configured to actuate the at least one securing mechanism upon actuating the lever.

In an exemplary embodiment of the computing device, the frame is secured to the bracket by at least one of fasteners, screws, and spot welding. In some embodiments of the computing device, the GPGPU carrier further comprises a PCIe interface connected to a PCIe cable.

In some embodiments, the locking mechanism further comprises an arm comprising a spring and lock feature. In some embodiments, the spring and lock feature interfaces with a corresponding locking element of the computing device upon securing the GPGPU carrier within the at least one slot. In some embodiments, disengaging the spring and lock feature from the corresponding locking element disengages the locking mechanism. In some embodiments, disengaging the locking mechanism comprises disengaging the at least one locking element of the computing device from the at least one securing mechanism.

DETAILED DESCRIPTION

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As discussed above, there is significant interest in developing means to efficiently and reliably add or remove a GPGPU for a computer system. In particular, there is significant interest in developing means that: (1) do not require tools to install a GPGPU into a computer system; (2) minimize space requirements for the GPGPU in the computer system; and (3) reduce or eliminate instances of incorrect installation of the GPGPU, which can result in damage to the GPGPU, the computer system, or connectors there between.

In view of the foregoing, the present disclosure contemplates a GPGPU carrier design for a computer system and computer systems therefrom that address the foregoing requirements. In particular, the present disclosure contemplates: (1) a GPGPU carrier design that allows a technician to easily and reliably install a GPGPU in the GPGPU carrier; and (2) a corresponding drive slot design for a computer system that allows mechanical and electrical installation of the GPGPU in the computer system with minimal effort and training on the part of the technician. Such a design is illustrated in FIGS. 1-9. While the present application is directed towards a carrier for multiple GPGPUs, the present application can be expanded to any component that can be combined within a single carrier. This could realize space savings for the server as some components can be placed in similar brackets. Further, coupling similar components within the same bracket as described in the present disclosure enables service without disconnecting the carrier's components.

Figure 1:
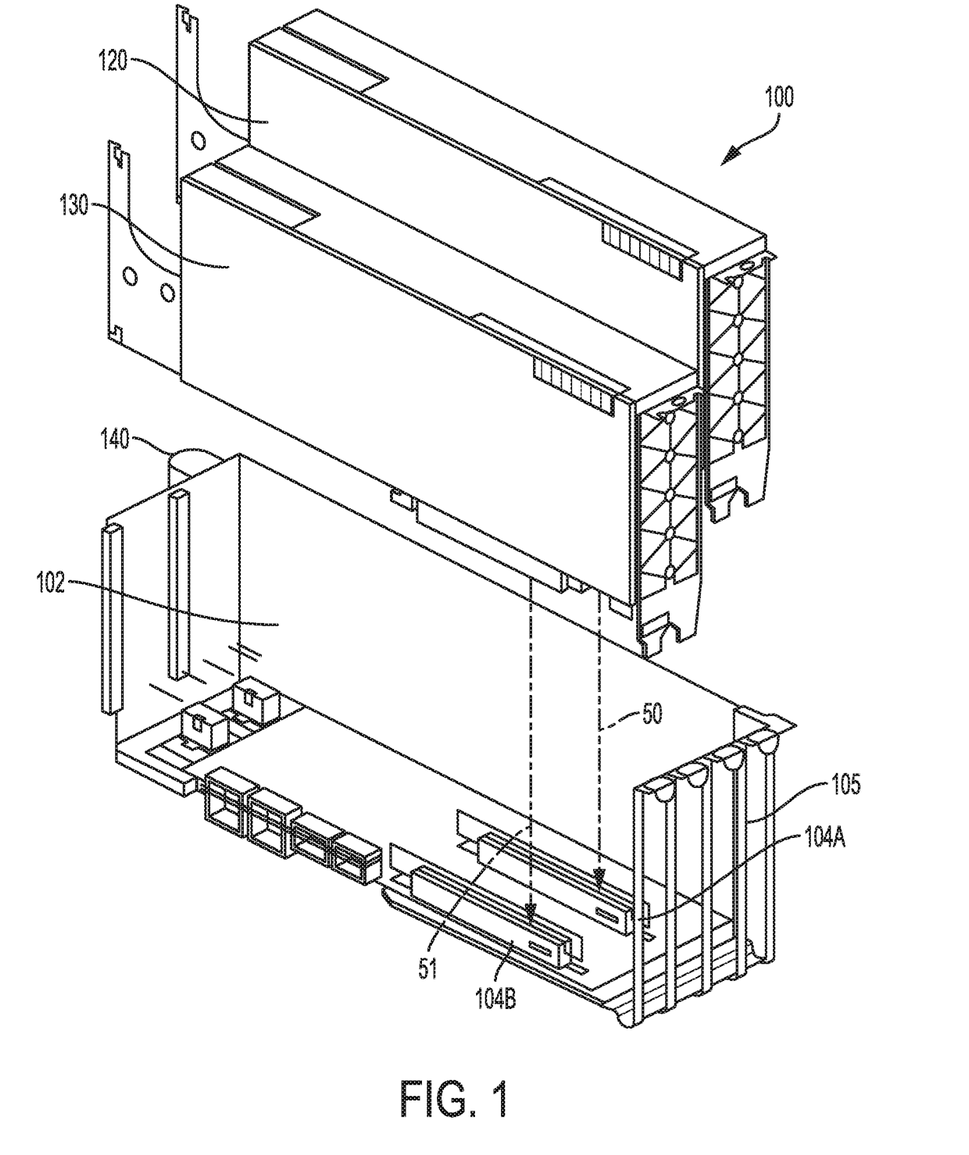
FIG. 1 is a top isometric views of a GPGPU carrier according to an embodiment.

FIG. 1 is a top isometric view of a GPGPU carrier 100 according to an embodiment. As shown in FIG. 1, the GPGPU carrier 100 includes a bracket 102 with a first receiving space 104A and a second receiving space 104B. The first receiving space 104A can receive a first GPGPU 120. The first GPGPU 120 can be inserted into the first receiving space 104A in direction 50. The second receiving space 104B can receive a second GPGPU 130. The second GPGPU 130 can be inserted into the second receiving space 104B in direction 51. The GPGPU carrier 100 can also include a frame 105. The frame 105 can be connected to the bracket 102 by known connection means. For example, the frame 105 can be secured to the bracket 102 by way of fasteners, screws, or spot welding. In some embodiments, the frame 105 and the bracket 102 can be made from a single element, such as plastic, metal, ceramics, and other high quality 3D printing materials.

The GPGPU carrier 100 and its components can be made of sheet metal using conventional metal fabrication techniques such as bending, forming, and stamping. As a result, the GPGPU carrier 100 can be made very inexpensively. Alternatively, the GPGPU carrier 100 and its components can be made of aluminum alloy, steel alloy, or any combination thereof. It should be realized that the GPGPU carrier 100 and its components can be made of any material constructed to withstand varying temperatures, and air flow of high velocity (from a plurality of fan modules not shown). The materials mentioned above are only for example, and not to limit this disclosure. A person having ordinary knowledge in the art may flexibly select any material in accordance with the disclosure.

Figure 2A:
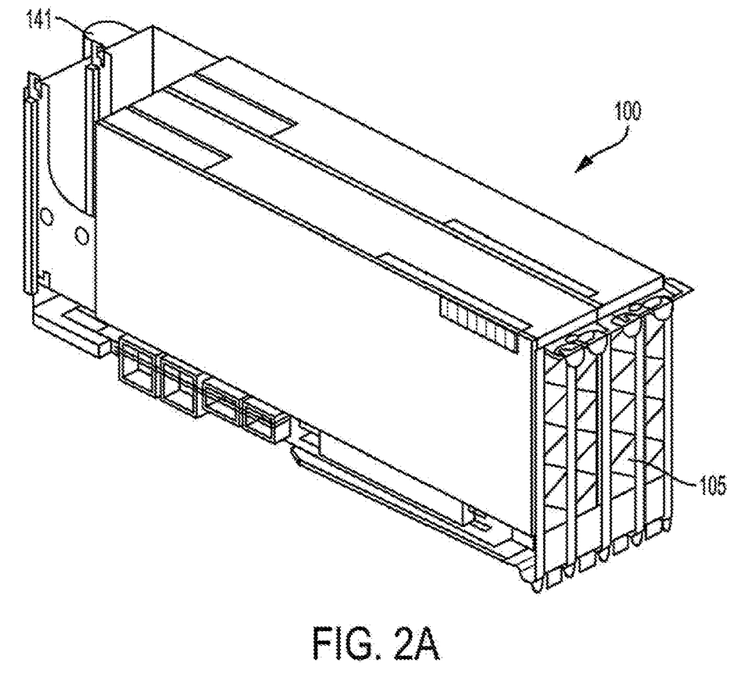
FIG. 2A is a top isometric view of a GPGPU carrier of FIG. 1, with the first and second GPGPUs installed according to an embodiment.
Figure 2B:
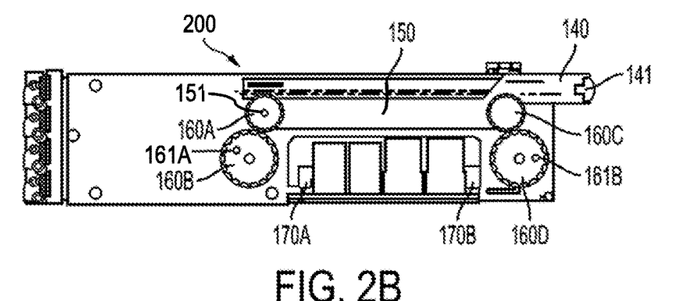
FIG. 2B is a bottom view of the GPGPU carrier of FIG. 1 according to an embodiment.
Figure 2C:
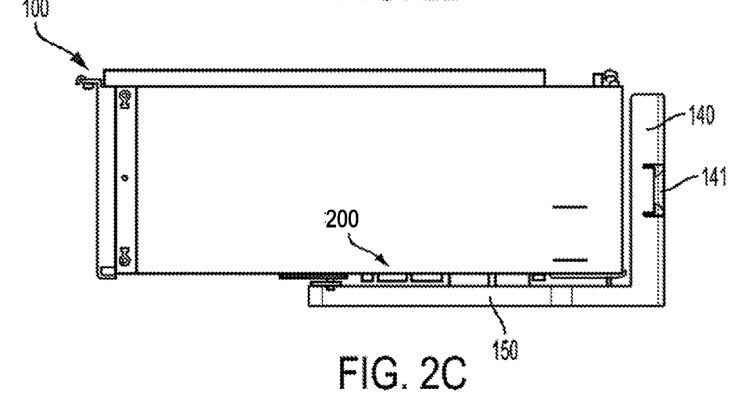
FIG. 2C is a side view of the GPGPU carrier of FIG. 1 according to an embodiment.

FIGS. 2A, 2B, and 2C illustrate an example embodiment of the GPGPU carrier 100 with the first GPGPU 120 and the second GPGPU 130 installed according to an embodiment. In the exemplary configuration of FIG. 2A, a locking mechanism 200 can be located on the GPGPU carrier 100. The locking mechanism 200 can include a latch mechanism that includes a lever 150 and an arm 140. The arm 140 is attached to a lever 150 by way of fastener, screws or spot welding. The fastener, screws or spot welding can be located at pivot point 151. The arm 140 can include a lock feature 141. In some embodiments, the lock feature 141 can include a spring and lock feature. The locking mechanism 200 can also include a series of gears 160A, 160B, 160C and 160D connected to the lever 150. The locking mechanism 200 can also include receiving elements 170A and 170B configured to align the GPGPU carrier 100 within a computing device (as discussed below). The gears 160B and 160D can include gear pins 161A and 161B, respectively configured to secure the GPGPU carrier 100 within the computing device (as discussed below).

Figure 3:
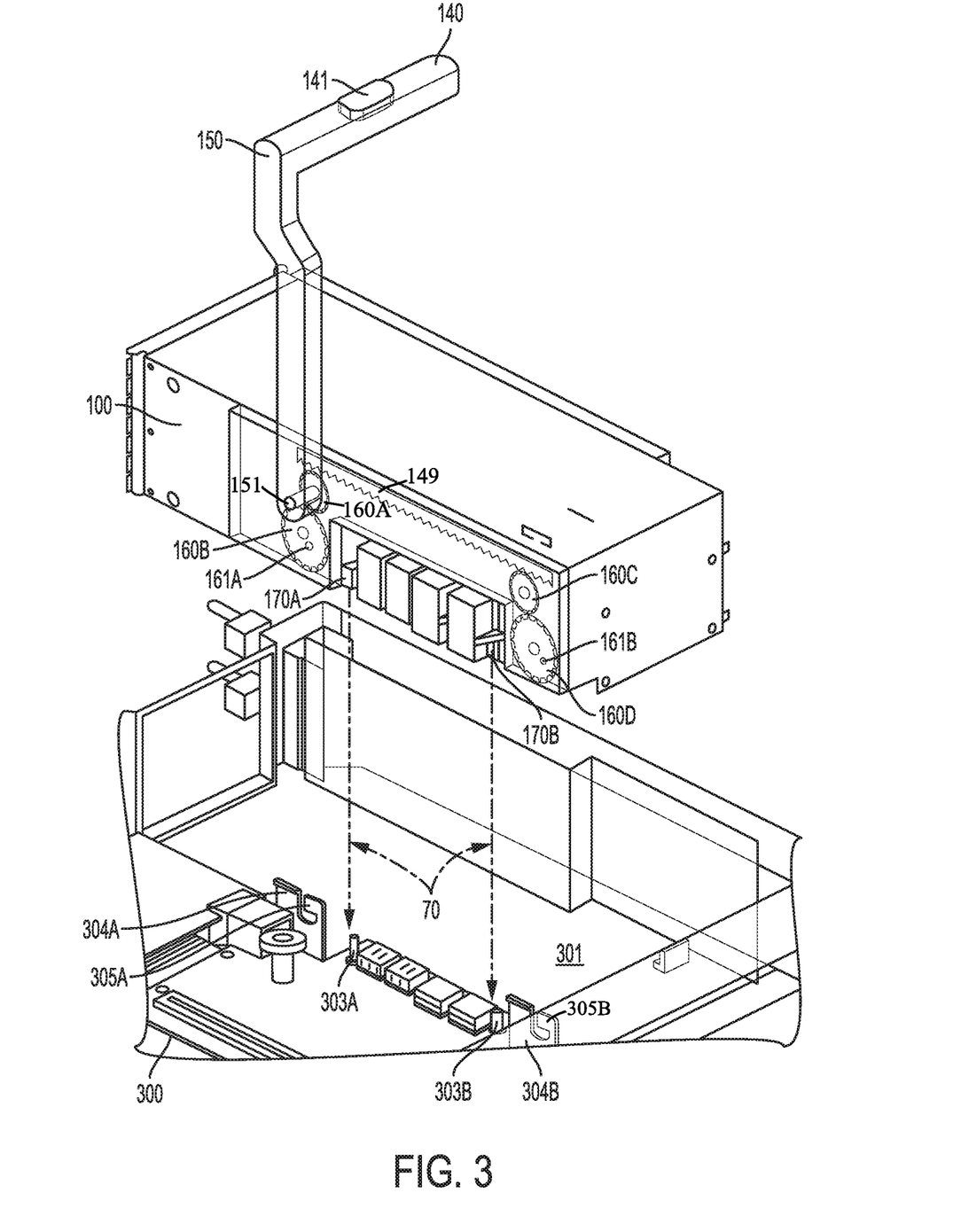
FIG. 3 show the GPGPU carrier of FIGS. 1 and 2 being inserted into a slot within a motherboard according to an embodiment.

In some embodiments, gears 160A and 160C can be mechanically connected to the lever 150 by a rack 149 (shown in FIG. 3). Specifically, the rack 149 (shown in FIG. 3) can include an initial teeth connected to gear 160A and gear 160C. Gear 160A can be connected to gear 160C by the rack 149 (shown in FIG. 3). Gears 160B and 160D can be directly connected to gears 160A and 160C. Gears 160A and 160C can be mechanically connected to receiving elements 170A and 170B. Thus, as the lever 150 is rotated via the arm 140, the gears 160A and 160C can be actuated to drive gears 160B and 160D. The gears 160B and 160D can include gear pins 161A and 161B, respectively. Upon actuating gears 160B and 160D, the locking mechanism can lock to secure the GPGPU carrier 100 within a computing device (as discussed below). It should be noted that the locking mechanism is not limited to the components listed herein. Furthermore, the locking mechanism can include any other mechanical features known in the art. Thus, when the GPGPU carrier 100 is installed within a server device (not shown), the first and second GPGPUs 120, 130 (from FIG. 1) can be connected to a mother board (discussed below).

FIG. 3 show the GPGPU carrier 100 of FIGS. 1, 2A, 2B, and 2C inserted into a slot 301 within a motherboard 300 according to an embodiment. The motherboard 300 includes a slot 301 configured to receive a GPGPU carrier 100 when both the first and second GPGPU 120, 130 (from FIG. 1) are installed. The GPGPU carrier 100 can be slid into the slot 301 in direction 70. The GPGPU carrier 100 can be aligned within the slot 301 using guide pins 303A and 303B. The slot 301 is configured to receive the GPGPU carrier 100 by aligning the guide pins 303A and 303B with the receiving elements 170A and 170B. The motherboard 300 can also include tab features 304A and 304B configured to rise vertically from the motherboard 300. The tab features 304A and 304B can include securing elements 305A and 305B, respectively. The securing elements 305A and 305B can be configured to secure the corresponding gear pins 161A and 161B.

For example, the guide pins 303A and 303B can engage the receiving elements 170A and 170B when the GPGPU carrier 100 is inserted into the slot 301. In some embodiments, the receiving elements 170A and 170B can include a receiving space to receive the guide pins 303A and 303B. Upon, proper alignment enabled by the receiving elements 170A and 170B and the guide pins 303A and 303B, the locking mechanism 200 can be actuated to drive the gear pins 161A and 161B to interlock with the securing elements 305A and 305B of the tab features 304A and 304B. As the lever 150 is rotated via the arm 140, the gears 160A and 160C can be actuated to drive gears 160B and 160D. The gear pins 161A and 161B, located at gears 160B and 160D, can be rotated to interlock within the securing elements 305A and 305B. Thus, upon rotating the lever 150, the locking mechanism 200 can secure the GPGPU carrier 100 within a computing device.

Once the gear pins 161A and 161B are interlocked with the securing elements 305A and 305B, the GPGPU carrier 100 is securely coupled to the motherboard 300. This is discussed in greater detail with reference to FIGS. 4-7. The connection facilitates an electrical connection between the first and second GPGPUs installed within the GPGPU carrier 100 to the motherboard 300.

Figure 4:
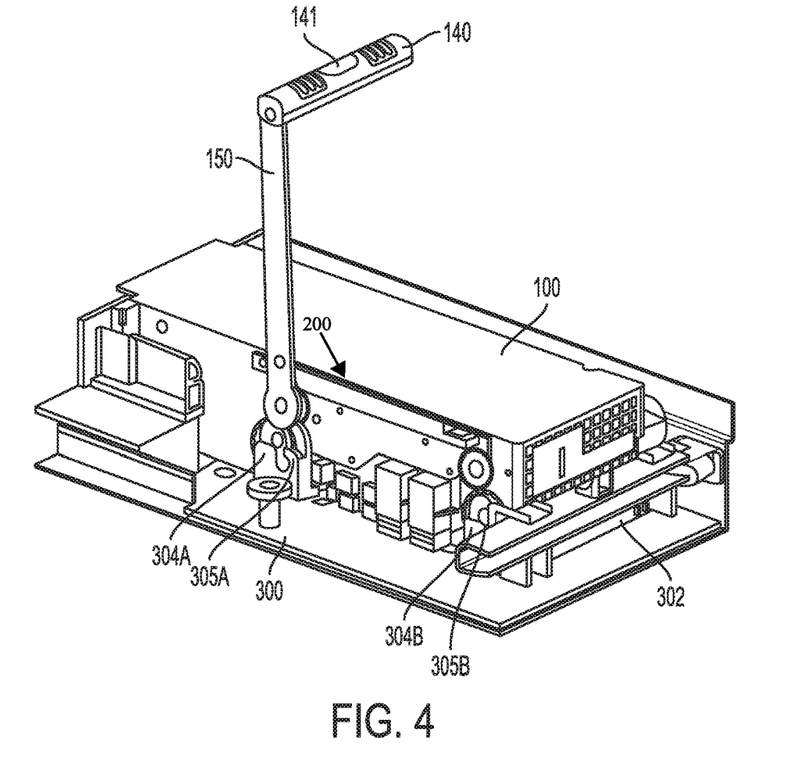
FIG. 4 shows a detailed view of the latch of the GPGPU carrier engaging with the locking mechanisms of the slot.

FIG. 4 shows the locking mechanism 200 of the GPGPU carrier 100 in the unlocked position as the gear pins 161A and 161B (from FIG. 3) engages the securing elements 305A and 305B. In some embodiments of the disclosure, the locking mechanism 200 can be spring loaded such that it returns back to its original position, i.e., unlocked position, after being engaged or disengaged to/from the locked position (discussed in greater detail below). The locking mechanism 200 can include a latch mechanism that includes a lever 150 and an arm 140. The arm 140 can include a lock feature 141.

Figure 5:
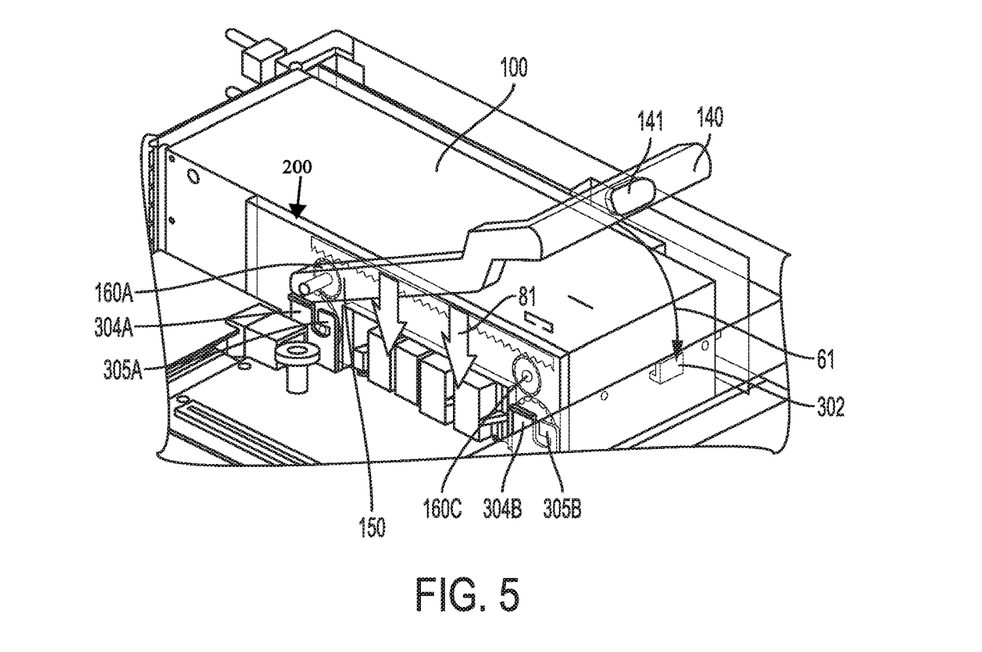
FIG. 5 shows the latch of the GPGPU carrier in the process of being secured to the locking mechanisms of the slot.
Figure 6:
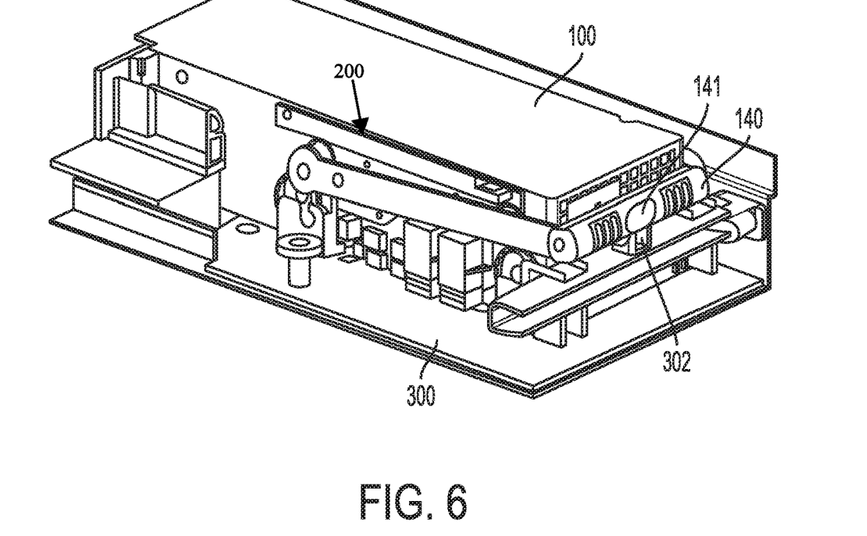
FIG. 6 shows the GPGPU carrier of FIG. 1 secured within the slot of the motherboard of a computing device.
Figure 7:
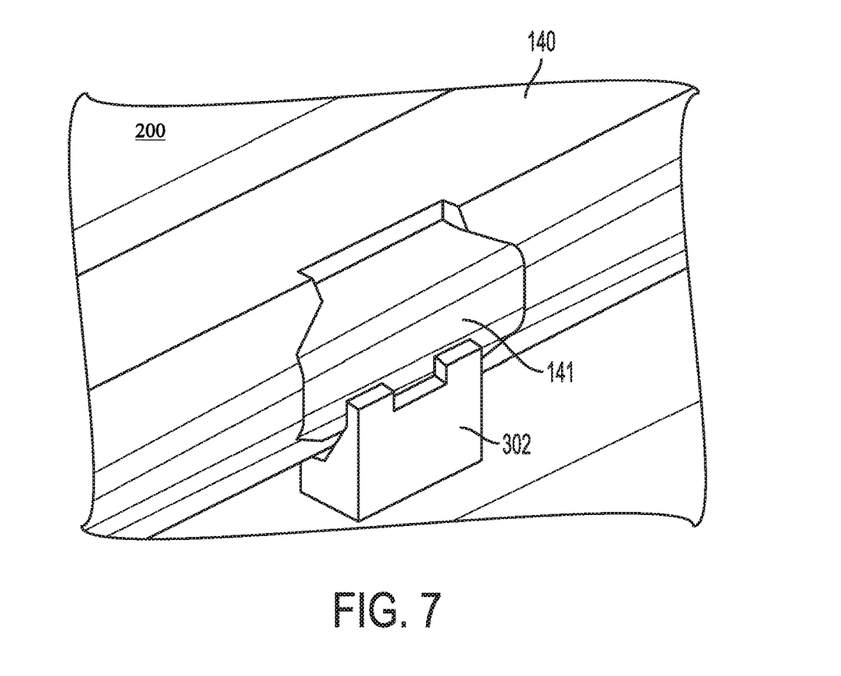
FIG. 7 shows the latch of the GPGPU carrier secured to the locking mechanisms of the slot.

FIGS. 5-7 illustrates the process of securing the locking mechanism 200 of the GPGPU carrier 100 within the slot 301 of the motherboard 300. Specifically, FIG. 5 shows the locking mechanism 200 of the GPGPU carrier 100 in the process of being secured within the slot 301 (shown in FIG. 3) of the motherboard 300. FIG. 6 illustrates the locking mechanism 200 of the GPGPU carrier 100 secured within the slot 301 (shown in FIG. 3) of the motherboard 300. Finally, FIG. 7 illustrates the lock feature 141 of the GPGPU carrier 100 secured to the locking element 302 of the motherboard 300. The lever 150 can be pulled down into the horizontal (locked) position by the handle 140. In some embodiments, a technician can actuate the handle 140 during initial installation, repair process or replacement. Upon pulling the handle 140 down in direction 61, the lever can be pulled in direction 81 actuating the locking mechanism 200 (as discussed with respect to FIGS. 2A, 2B and 2C). Upon actuation of the locking mechanism 200, the lock feature 141 can interface with a corresponding locking element 302. The lock feature 141 can be configured as a spring latch that engages the corresponding locking element 302 when the lever 150 is in a horizontal position. The lock feature 141 disengages the corresponding locking element 302 when the spring latch is released.

Upon engagement with the corresponding locking element 302, the locking mechanism 200 is in the locked position. However, the present disclosure contemplates that any other type of mechanism can be used for latch element 141. Further, although the exemplary GPGPU carrier 100 only illustrates a single latch element 141 at the handle 140, the present disclosure contemplates that the number and position(s) of locking elements can vary. For example, a locking element may be located at either distal ends of the handle 140 in the locked position.

Figure 8:
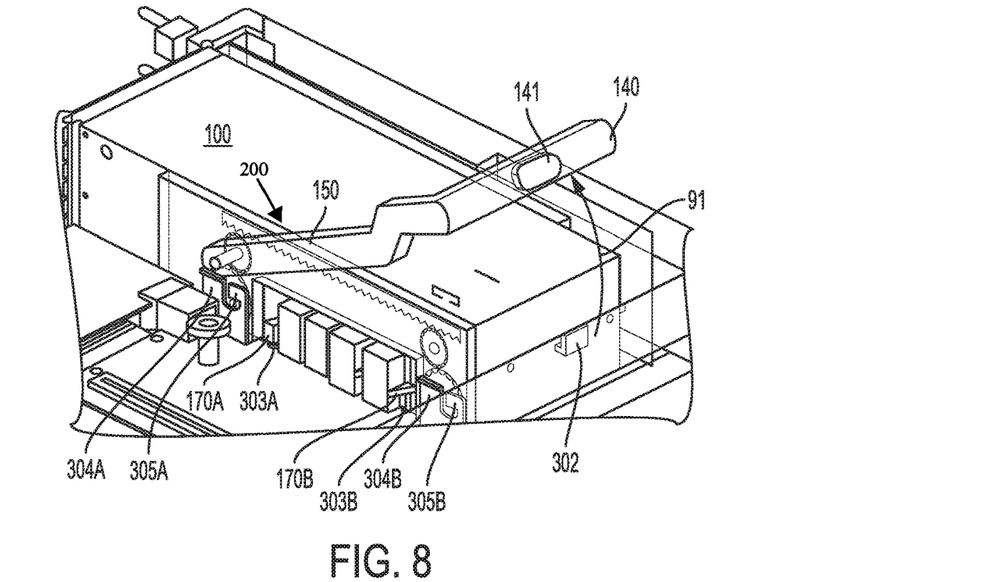
FIG. 8 shows the latch of the GPGPU carrier in the process of being released from the locking mechanisms of the slot.
Figure 9:
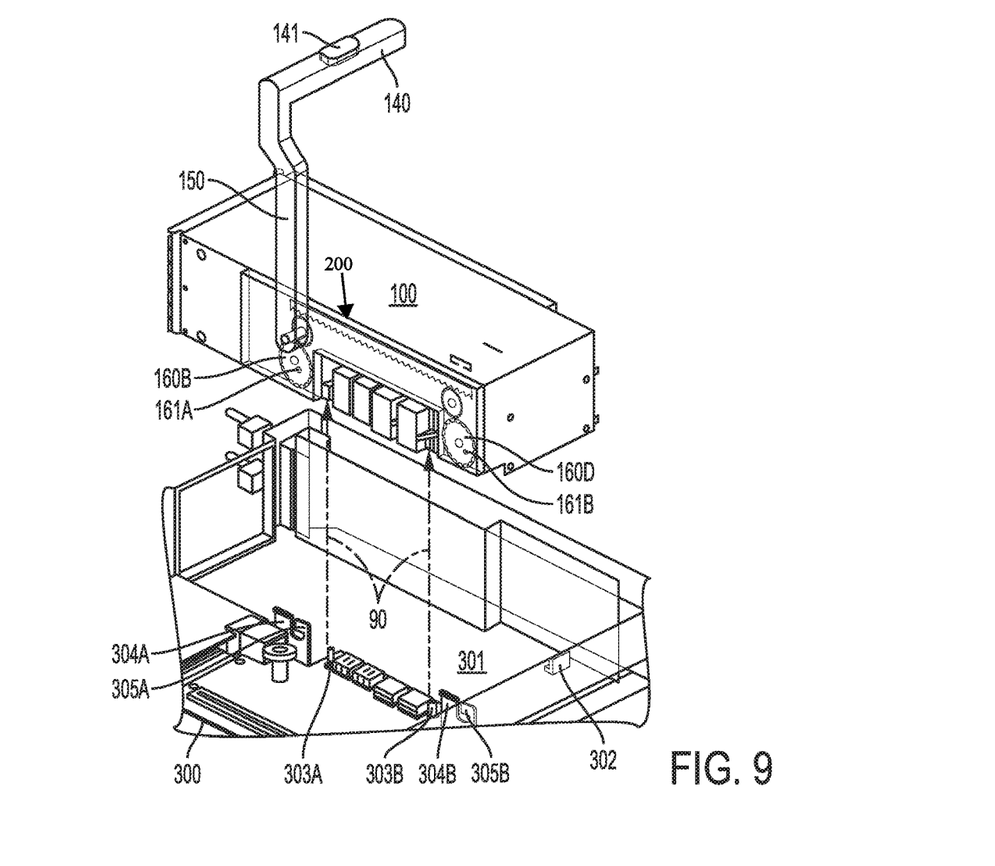
FIG. 9 shows the latch of the GPGPU carrier being removed from the slot within the motherboard of the computing device.

FIGS. 8-9 illustrates the process of releasing the locking mechanism 200 of the GPGPU carrier 100 from the slot 301 of the motherboard 300. Specifically, FIG. 8 shows the locking mechanism 200 of the GPGPU carrier 100 in the process of being released from the slot 301 of the motherboard 300. FIG. 9 illustrates the locking mechanism 200 of the GPGPU carrier 100 released from the slot 301 of the motherboard 300. The lock feature 141 disengages the corresponding locking element 302 when the spring latch is released. In some embodiments of the disclosure, the locking mechanism 200 can be spring loaded such that it returns back to the unlocked position, after the locking element 302 is disengaged. Thus, the lever 150 can be released into the vertical (unlocked) position by the lock feature 141. Upon disengaging the lock feature 141, the handle 140 can travel in direction 91.

The lever 150 can be released, disengaging the locking mechanism 200. Upon disengaging the locking mechanism 200, the lever 150 can drive gears 160A and 160C (shown in FIG. 2B). Gears 160B and 160D (shown in FIG. 2B) can be driven by gears 160A and 160C (shown in FIG. 2B) such to release the gear pins 161A and 161B from the securing elements 305A and 305B. Thus, as the lever 150 is rotated via the arm 140 in direction 91 to release the GPCPU carrier 100 from the motherboard 300, the gears 160A and 160C (shown in FIGS. 2B and 2C) can be actuated. Upon actuating the gears 160A and 160C, gears 160B and 160D can be driven to release the gear pins 161A and 161B. Upon release of the lock feature 141, the gear pins 161A and 161B are disengaged from the corresponding securing elements 305A and 305B. Upon disengagement with the corresponding securing elements 305A and 305B, the locking mechanism 200 is in the unlocked position. Moreover, the GPGPU carrier 100 can be removed from the slot 301 of the motherboard 300 in direction 90.

Figure 10:
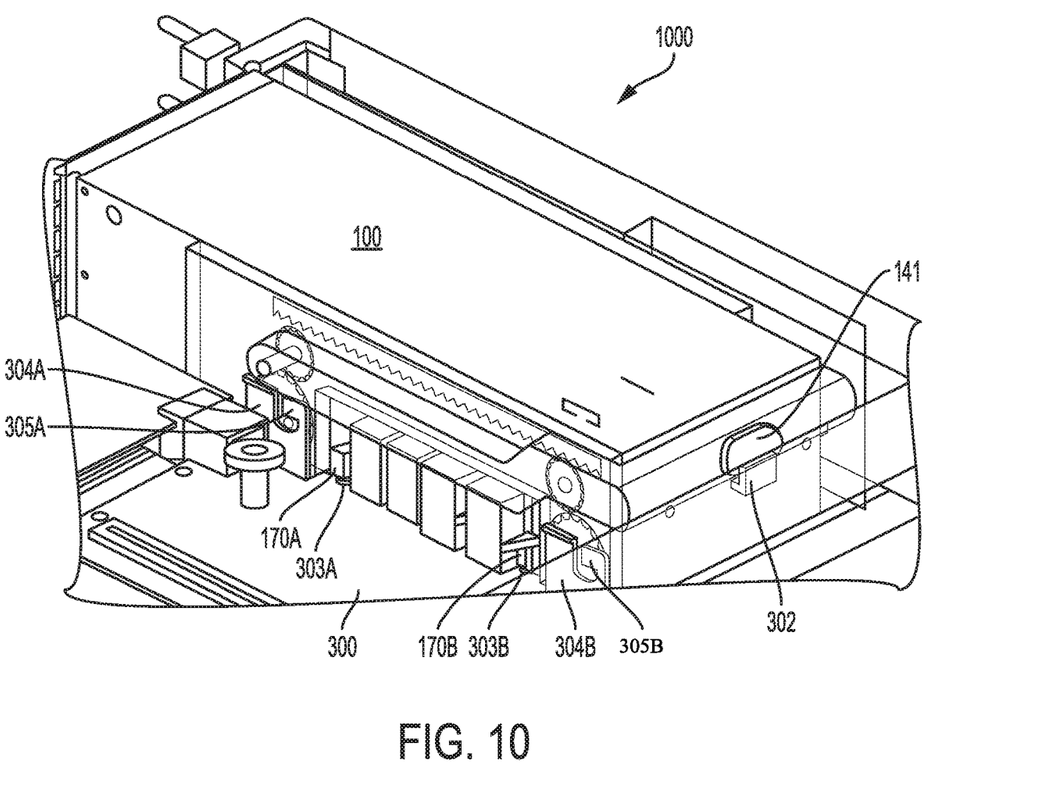
FIG. 10 shows the GPGPU carrier of FIG. 1 secured within the slot of the motherboard of a computing device.

FIG. 10 shows the GPGPU carrier 100 (of FIG. 1) being inserted into a slot (not shown) within a motherboard 300 of a computing device 1000. Now that the configuration and operation of the GPGPU carrier 100 has been described, the disclosure now turns to a description of the configuration and operation of motherboard slot for receiving the GPGPU carrier 100. The GPGPU carrier 100 is configured in a locked position with both the first GPGPU and the second GPGPU installed according to an embodiment. The computing device 1000 can be a standalone computer, a server, or any other type of computing device.

In this configuration, the interaction of the receiving elements 170A and 170B of the GPGPU carrier 100 and the guide pins 303A and 303B of the motherboard 300 operates to cause the connector (not shown) of the GPGPU carrier 100 to engage the connector (not shown) of the motherboard 300. It should be noted, that in some embodiments releasing the gear pins 161A and 161B (from FIG. 9) of the GPGPU carrier 100 and the securing elements 305A and 305B of the motherboard 300 does not disconnect a connector. Thus, this allows a technician to service either the first or second GPGPU, without disconnecting the GPGPU carrier 100 from the motherboard 300.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art, upon reading and understanding this specification and the annexed drawings. In addition, while a particular feature of the invention may have been disclosed with respect to only one of several implementations, such feature may be combined with one or more other features of the other implementations, as may be desired and advantageous for any given or particular application.

The terminology used herein is for the purpose of describing particular embodiments only and is not intended to limit the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A computing device, comprising:
   at least one slot, the at least one slot that comprises at least one securing element configured to receive a general purpose graphic processing unit (GPGPU) carrier; and
   the GPGPU carrier for removable insertion into the at least one slot, the GPGPU carrier comprising:
      a bracket comprising a first receiving space for securing a first GPGPU, a second receiving space for securing a second GPGPU, and
      a locking mechanism connected to the bracket configured to secure the at least one securing element of the computing device to a corresponding at least one engagement mechanism, the at least one securing element comprising a first securing element and a second securing element, the at least one engagement mechanism comprising a first drive gear including a gear pin and a second drive gear including a gear pin,
   wherein the locking mechanism comprises a lever connected to a plurality of gear drives including the first drive gear and the second drive gear, the plurality of drive gears configured to actuate the gear pins of the first and second drive gears to engage the respective first and second securing elements upon actuating the lever,
   wherein the plurality of gear drives is connected to the lever via a plurality of teeth of a rack of the lever, and
   wherein the first drive gear and the second drive gear are located at different sides of the rack.

2. The computing device of claim 1, wherein a frame is secured to the bracket by at least one of fasteners, screws, and spot welding.

3. The computing device of claim 1, wherein the GPGPU carrier further comprises at least one receiving element configured to receive a corresponding at least one guide pin located within the at least one slot.

4. The computing device of claim 1, wherein the locking mechanism further comprises an arm comprising a spring and lock feature.

5. The computing device of claim 4, wherein the spring and lock feature interfaces with a corresponding locking element of the computing device upon securing the GPGPU carrier within the at least one slot.

6. The computing device of claim 5, wherein disengaging the spring and lock feature from the corresponding locking element disengages the locking mechanism.

7. The computing device of claim 5, wherein disengaging the locking mechanism comprises disengaging the at least one locking element of the computing device from the at least one securing mechanism.

8. A general purpose graphic processing unit (GPGPU) carrier comprising:
   a bracket comprising a first receiving space for securing a first GPGPU, a second receiving space for securing a second GPGPU; and
   a locking mechanism connected to the bracket configured to secure at least one securing element of a computing device to at least one corresponding engagement mechanism of the GPGPU carrier, the at least one securing element comprising a first securing locking element and a second securing element, the at least one engagement mechanism comprising a first drive gear including a gear pin and a second drive gear including a gear pin,
   wherein the locking mechanism comprises a lever connected to a plurality of gear drives including the first drive gear and the second drive gear, the plurality of drive gears configured to actuate the gear pins of the first and second drive gears to engage the respective first and second securing elements upon actuating the lever,
   wherein the plurality of gear drives is connected to the lever via a plurality of teeth of a rack of the lever, and
   wherein the first drive gear and the second drive gear are located at different sides of the rack.

9. The GPGPU carrier of claim 8, wherein a frame is secured to the bracket by at least one of fasteners, screws, and spot welding.

10. The GPGPU carrier of claim 8, wherein the GPGPU carrier further comprises at least one receiving element configured to receive a corresponding at least one guide pin located within the computing device.

11. The GPGPU carrier of claim 8, wherein the locking mechanism further comprises an arm comprising a spring and lock feature.

12. The GPGPU carrier of claim 11, wherein the spring and lock feature interfaces with a corresponding locking element of the computing device upon securing the GPGPU carrier within the at least one slot.

13. The GPGPU carrier of claim 12, wherein disengaging the spring and lock feature from the corresponding locking element disengages the locking mechanism.

14. The GPGPU carrier of claim 13, wherein disengaging the locking mechanism comprises disengaging the at least one locking element of the computing device from the at least one securing mechanism.

15. The computing device of claim 1, wherein the locking mechanism is actuated to drive the first locking element and the second locking element to interlock with the first locking element and the second locking element, respectively.

16. The computing device of claim 1, wherein the lever comprises a lock feature to be secured to a locking element of a motherboard for the GPGPU.

* * * * *